Feb. 4, 1964 D. E. CORNELL III 3,120,583

MULTIPLE SWITCH DEVICE FOR SELECTIVELY INTERCONNECTING MULTIPLE ELECTRICAL CONDUCTORS

Filed July 1, 1960

INVENTOR.
Dudley E. Cornell III
BY John F. Brezina
Atty.

3,120,583

MULTIPLE SWITCH DEVICE FOR SELECTIVELY INTERCONNECTING MULTIPLE ELECTRICAL CONDUCTORS

Dudley E. Cornell III, Albuquerque, N. Mex., assignor to Teaching Machines, Inc., Albuquerque, N. Mex., a corporation of Pennsylvania Filed July 1, 1960, Ser. No. 40,317
5 Claims. (Cl. 200—5)

My invention is directed to a novel multiple switch or binary encoding device selectively interconnecting multiple electrical conductors or circuits which are printed or otherwise reproduced on a flat base member.

In many electronic devices and satellite and missile systems a large number of signals are controlled and operated by a relatively small number of relays by means of reducing each signal to a code, for example, the binary code, in which different combinations of electrical circuits are selectively and separately closed and opened to effect different specific results and objectives; each specific combination of circuits, when closed, being adapted to produce a particular specific signal or to energize a separate electrical unit or device.

It is an important object of my invention to provide a novel binary encoding device for selectively and simultaneously closing a plurality of printed or etched electrical circuits which may comprise a part of various electronic devices or machines or which are electrically connected to operate electrically responsive devices; and which includes a plurality of circuits etched or printed on a flat non-conductive base. Such printed circuit binary encoding device also includes a flexible pad having keyed or indicia-bearing flexible members; a plurality of metal circuit closing and shorting bars having variously spaced projecting contact members thereon; and a plurality of depressible springs positioned over said shorting bars which are adapted, when depressed, to effect electrical contact between specific combinations of circuits.

A further important object of my invention is the provision of a device adapted to either form part of an electronic apparatus, or to be operatively connected to an electronic apparatus and which includes a plurality of separate electrical circuits carried by a flat base member, and in which a plurality of metal contacting bars having projections thereon at varying positions are positioned above said electrical circuits, and in which a plurality of separate flexible elements are positioned above said contact bars and wherein a plurality of indicia-bearing flexible members are mounted above said flexible members and above said contact bars and which are adapted, upon depression thereof, to close one or more of the selected electrical circuits, said electrical circuits being adapted to energize or activate various signals or parts of electronic machines and apparatus.

A further object of my invention is to provide printed circuit binary encoding devices, as described in the foregoing paragraphs, and which eliminate the need for and supplant a plurality of multiple pole single throw switches and provide for quick and easy contact connection of a plurality of electrical circuits, and which are economical to manufacture and install.

A further object of my invention is to provide an economical binary encoding device, presenting a simulated typewriter keyboard to the operator adapted to be used as the input system for electronic teaching machines.

Other and further important objects of my invention will be apparent from the following description and appended claims.

Figure 2:
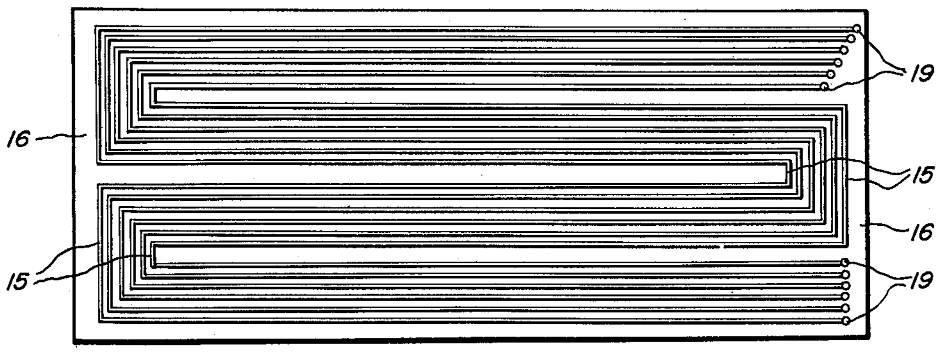
FIG. 2 is a top plan view of a flat base or panel having a plurality of separate electrical circuits reproduced thereon.
Figure 3:
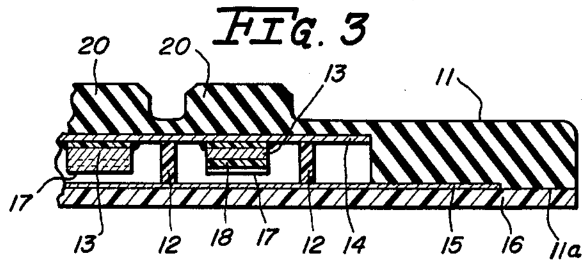
FIG. 3 is an enlarged section on a vertical plane of a corner portion of the device shown in FIG. 1, and taken substantially on line 3—3 of FIG. 1, and showing interior parts in cross section.

Referring to FIGS. 2 and 3, numeral 16 designates a suitable flat sheet, panel, or base, formed of non-conductive material. Numerals 19 designate suitable terminals or connection points on opposite ends of a plurality of spaced apart electrical circuits 15 which are reproduced in zig-zag spaced apart positions on said panel 16 to provide for super-positioning of a relatively large number of separate manually actuable circuit connection devices and means as hereinafter described. The terminals 19 are adapted to be normally connected to different electrically responsive devices and circuits which form part of or are connected to electronic apparatus and devices.

Numeral 11 designates a flexible yieldable pad, preferably of rubber or rubber-like composition, and which covers and is mounted over the base 16 and circuits 15 and has its integral depending peripheral edge 11*a* extending downwardly to contact the periphery of base 16, as indicated in FIG. 3.

Figure 1:
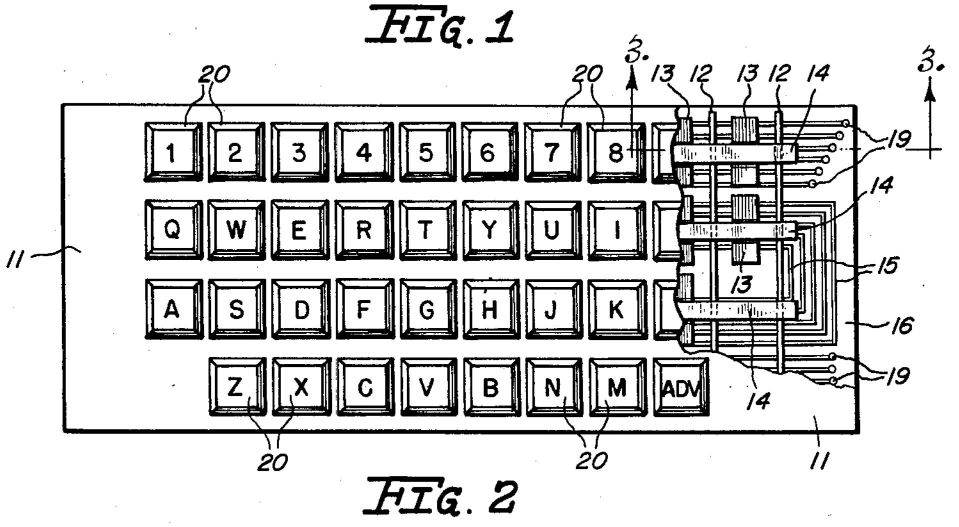
FIG. 1 is a top plan view of my circuit closing binary encoding device with parts broken away to show some of the interior parts.

Said flexible pad 11 has a plurality of upwardly extending integral spaced apart bosses or projections 20, preferably formed integral therewith, and positioned in transverse and longitudinal rows, as indicated in FIG. 1. These projecting bosses are positioned to overlie the respective groups of the zig-zag circuits 15.

As illustrated in FIGS. 1 and 3, a plurality of metal shorting bars or contact bars 13 having integral spaced apart downwardly extending and projecting contacts 17 are mounted a short distance above the respective groups of spaced apart circuits 15 and transversely thereof, and the same are also positioned to lie under the upwardly projecting bosses 20, respectively (see FIG. 3).

Figure 4:
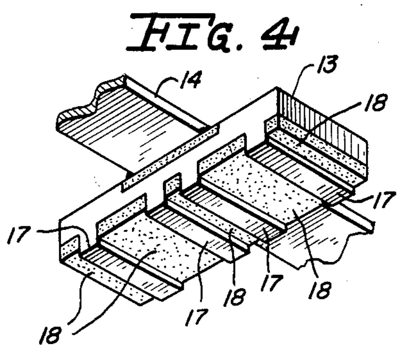
FIG. 4 is an enlarged perspective view of the underside and edge portions of one of the contact or shorting bars which are positioned above said circuits and showing the integral spaced apart projecting contacts thereon.

As shown in FIG. 4, between the respective integral contacts 17 on each contact bar 13 is an insulating adhesive cast in place providing spacers 18. These non-conductive spacers 18 are nearly level or flush with the lower faces of contacts 17 so that said contacts will not be tilted if all the contacts 17 are on one side of any of the bars 13 and the insulation spacers on the other side thereof.

In other words, one of said contact bars 13 is positioned below each of said projecting depressible bosses or projections 20 and so that its integral contact members 17 be disposed parallel to the adjacent portions of the circuits 15. Each of said shorting bars 13 are positioned above the respective circuits 15 and two or more contact members 17 on a particular contact bar 13, when depressed, will contact the particular circuits 15 which are below such contact members of the depressed contact bar. Each contact or shorting bar 13 has its integral contact members 17 spaced apart differently, so that a different combination of circuits will be contacted by each of said shorting bars, when depressed.

In the preferred form of my invention, a plurality of relatively thin flexible springs 14 are mounted upon the longitudinally spaced apart insulating spacers 12, and each of said yieldable metal springs 14 are positioned below one longitudinal row of the yieldable indicia-bearing bosses, and are also positioned so as to traverse each row of shorting bars, each row of said shorting and contact bars 13 being suitably secured to one longitudinally extending spring 14, as partly illustrated in FIG. 1.

A plurality of short non-compressible elongated nonconductive insulating strips or spacers 12, are mounted, for example, by suitable cement on the upper face of the circuit board or base 16, and these normally hold said springs in upper position and hold the connected contact bars 13 above and out of contact with the circuits 15. Two of said insulating spacers 12 are shown in cross section in FIG. 3.

Each of the bosses or projections 20 of the pad 11 have different indicia stencilled or otherwise reproduced thereon, for example, numbers and letters each of which are coded and designate a different combination of circuits.

The manual depression of any one of said projecting bosses 20 will cause the springs 14 therebelow to be flexed to effect contact of the contacts of the depressed shorting bars with specific circuits, to thereby electrically contact a predetermined combination of circuits. Release of manual pressure on specific bosses 20 will cause the resilient depressed springs 14 to return said contact bars upward out of contact with the particular circuits. The connection of each particular combination of circuits is adapted to act as a switch for closing of other circuits of various electronic devices.

Figure 5:
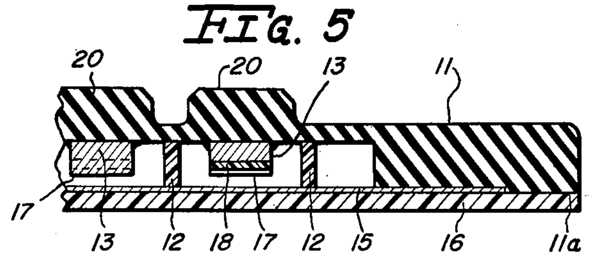
FIG. 5 is a cross section of a corner segment of a modified form of my device wherein the respective circuit shorting bars are mounted directly on the inner face of the resilient pad.

In FIG. 5, I have illustrated a modification of my aforesaid invention wherein the flexible springs 14 are eliminated. In this form, the respective metal shorting and contact bars 13, one of which is illustrated in FIG. 4, are suitably cemented in spaced apart relation directly to the under face of the flexible pad 11 and in such spaced apart positions that each of said contact bars 13 lie below one of the indicia bearing projections or bosses 20 and lie over the respective rows of circuits on base 16. In this form, manual depression of any of the projections 20 will move downward the particular contact bar below it, to thereby electrically connect a particular combination of circuits.

An important advantage of my printed circuit binary encoding device is that it can be economically manufactured and assembled and easily operated.

One of the many advantageous uses of my said device is as an electrical input system for electronic teaching machines.

While the foregoing specification sets forth the invention in specific terms, it is to be understood that numerous changes in the shape, size and materials may be resorted to without departing from the spirit and scope of the invention as claimed hereinafter and it is contemplated that various changes may be made in the embodiment of the invention herein specifically described without departing from or sacrificing any of the advantages of the invention or any features thereof, and nothing herein shall be construed as limitations upon the invention, its concept or structural embodiment as to the whole or any part thereof except as defined in the appended claims.

I claim:

1. A multiple switch device for selectively interconnecting multiple electrical conductors comprising,
a non-conductive base panel;
a series of conductors electrically independent of each other arranged in parallel on said panel;
multiple conductive bars bridging said conductor series;
each of said bars having contact means simultaneously contacting only a selected plurality of said conductors to thereby electrically interconnect the selected conductors, said contact means of each bar differing from the contact means of the other bars whereby a different plurality of said conductors is contacted by each bar;
and means for resiliently supporting said bars over said conductors normally out of contact therewith and selectively depressible into contact therewith.

2. A multiple switch device as defined in claim 1 wherein said contact means comprises projections on said bars extending towards said conductors,
individual bars having projections spaced apart across said conductor series for contacting non-adjacent conductors while avoiding contact with intervening conductors.

3. A multiple switch device for selectively interconnecting multiple electrical conductors comprising,
a non-conductive base panel;
a series of conductors electrically independent of each other arranged in parallel on said panel;
multiple conductive bars bridging said conductor series; each of said bars having contact means simultaneously contacting only a selected plurality of said conductors to thereby electrically interconnect the selected conductors, said contact means of each bar differing from the contact means of the other bars whereby a different plurality of said conductors is contacted by each bar; a flexible pad having multiple spaced-apart outer indicia-bearing members;
means mounting said pad over said conductors;
and means for resiliently supporting said bars between said pad and said conductors with the bars maintained normally out of contact with the conductors and selectively depressible into contact therewith, said bars being disposed under said indicia-bearing members respectively;
the depression of any of said indicia-bearing members flexing adjacent portions of said pad and depressing the bar thereunder selectively into contact with said conductors contacted by the bar.

4. A multiple switch device for selectively interconnecting multiple electrical conductors comprising,
a non-conductive base panel;
a series of conductors electrically independent of each other arranged in parallel on said panel;
multiple conductive bars bridging said conductor series;
each of said bars having contact means simultaneously contacting only a selected plurality of said conductors to thereby electrically interconnect the selected conductors, said contact means of each bar differing from the contact means of the other bars whereby a different plurality of said conductors is contacted by each bar;
a flexible pad having multiple spaced-apart outer indicia-bearing members;
means mounting said pad over said conductors;
an elongated spring disposed between said pad and said conductors with the pad seated on the spring;
non-conductive spacer means disposed between said spring and said conductors and supporting the spring apart from the conductors at spaced points along the spring, said spring being resiliently depressible between said spaced points towards said conductors;
and means mounting said bars on said spring between the spring and said conductors with the bars respectively disposed singly between pairs of adjacent said spaced points, said bars being supported by said spring normally out of contact with the conductors and selectively depressible into contact therewith, said bars being disposed under said indicia-bearing members respectively and said spring being disposed between the bars and the indicia-bearing members;
the depression of any of said indicia-bearing members flexing adjacent portions of said pad and depressing said spring and the bar under the member selectively into contact of the bar with said conductors contacted thereby.

5. A multiple switch device as defined in claim 4 wherein said conductors are printed on said panel;

said pad and indicia-bearing members comprise an integral one-piece structure;

said indicia-bearing members are arranged in a plurality of rows;

a said elongated spring having said bars mounted thereon is constructed of metal and disposed under each of said rows;

said contact means comprises projections on said bars extending towards said conductors, individual bars having projections spaced apart across said conductor series for contacting non-adjacent conductors while avoiding contact with intervening conductors;

and said bars and projections comprise integral one-piece metal structures.

References Cited in the file of this patent

UNITED STATES PATENTS

| | | |
|---|---|---|
| Re. 13,629 | Church | Oct. 21, 1913 |
| Re. 16,365 | Kempien | June 22, 1926 |
| 486,212 | Leland | Nov. 15, 1892 |
| 979,391 | Griffen | Dec. 20, 1910 |
| 2,128,058 | Shaw | Aug. 23, 1938 |
| 2,854,552 | Gouverneur | Sept. 30, 1958 |
| 2,931,108 | Brown | Apr. 5, 1960 |
| 2,943,399 | Davis | July 5, 1960 |
| 3,035,211 | Mitchell | May 15, 1962 |